(12) United States Patent
Bedell et al.

(10) Patent No.: US 9,308,714 B2
(45) Date of Patent: Apr. 12, 2016

(54) METHOD FOR IMPROVING SURFACE QUALITY OF SPALLED SUBSTRATES

(71) Applicant: International Business Machines Corporation, Armonk, NY (US)

(72) Inventors: Stephen W. Bedell, Wappingers Falls, NY (US); Keith E. Fogel, Hopewell Junction, NY (US); Paul A. Lauro, Brewster, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/785,839

(22) Filed: Mar. 5, 2013

(65) Prior Publication Data

US 2014/0251548 A1    Sep. 11, 2014

(51) Int. Cl.
*B32B 38/10* (2006.01)
*B32B 43/00* (2006.01)
*C03C 17/00* (2006.01)
*H01L 31/18* (2006.01)

(52) U.S. Cl.
CPC ............ *B32B 43/006* (2013.01); *C03C 17/00* (2013.01); *H01L 31/1896* (2013.01); *Y10T 156/11* (2015.01); *Y10T 156/1168* (2015.01); *Y10T 156/1978* (2015.01)

(58) Field of Classification Search
CPC   B32B 38/10; B32B 43/006; Y10T 156/1978; Y10T 156/1168
See application file for complete search history.

(56) References Cited

U.S. PATENT DOCUMENTS

| | | | |
|---|---|---|---|
| 6,121,118 | A | 9/2000 | Jin et al. |
| 6,217,655 | B1 | 4/2001 | Kumar et al. |
| 6,248,648 | B1 | 6/2001 | McKenna et al. |
| 6,835,415 | B2 | 12/2004 | Blaedel et al. |
| 6,933,212 | B1 | 8/2005 | Lee et al. |
| 7,108,591 | B1 | 9/2006 | Boyd et al. |
| 7,541,826 | B2 | 6/2009 | Koliopoulos et al. |
| 2010/0311250 | A1 | 12/2010 | Bedell et al. |
| 2013/0005116 | A1 * | 1/2013 | Bedell et al. ............... 438/462 |

OTHER PUBLICATIONS

Thornton, J.A., "Internal stresses in titanium, nickel, molybedenum, and tantalum films deposited by cylindrical magnetron sputtering", J. Vac. Sci. Technol., Jan./Feb. 1977, vol. 14, No. 1.

* cited by examiner

*Primary Examiner* — Mark A Osele
*Assistant Examiner* — Nickolas Harm
(74) *Attorney, Agent, or Firm* — Scully, Scott, Murphy & Presser, P.C.; Louis J. Percello, Esq.

(57) ABSTRACT

A compliant material is formed between a base substrate and a support structure prior to performing a controlled spalling process. By positioning the compliant material between the base substrate and the support structure, the localized effects of surface perturbations (particles, wafer artifacts, etc.) on spalling mode fracture can be reduced. The method of the present disclosure thus leads to improved surface quality of the spalled material layer and the remaining base substrate. Moreover, the method of the present disclosure can reduce the density of cleaving artifacts.

24 Claims, 4 Drawing Sheets

METHOD FOR IMPROVING SURFACE QUALITY OF SPALLED SUBSTRATES

BACKGROUND

The present disclosure relates to substrate fabrication and substrates fabricated thereby. More particularly, the present disclosure relates to a method to improve the surface of a substrate during a controlled spalling process.

Devices such as, for example, photovoltaic and electro-optical, that can be produced in thin-film form have three clear advantages over their bulk counterparts. First, by virtue of less material used, thin-film devices ameliorate the materials cost associated with device production. Second, low device weight is a definite advantage that motivates industrial-level effort for a wide range of thin-film applications. Third, if dimensions are small enough, devices can exhibit mechanical flexibility in their thin-film form. Furthermore, if a device layer is removed from a substrate that can be reused, additional fabrication cost reduction can be achieved.

Efforts to (i) create thin-film substrates from bulk materials (i.e., semiconductors) and (ii) form thin-film device layers by removing device layers from the underlying bulk substrates on which they were formed are ongoing. The recent development, see, for example, U.S. Patent Application Publication No. 2010/0311250 A1 to Bedell et al., of a novel layer transfer method referred to as 'controlled spalling technology' has permitted the fabrication of low-cost, thin-film, high quality substrates by removing a surface layer from a base substrate. The thin-film substrate layers that can be removed by this controlled spalling technology can be used to 1) increase the cost per Watt value of conventional photovoltaic technology or 2) permit fabrication of novel, high-efficiency photovoltaic, electronic and opto-electronic materials that are flexible and can be used to produce new products.

Despite being able create thin-film substrates, a method is needed to improve the reusability of the base substrate after controlled spalling and improve the surface quality of the spalled surfaces.

SUMMARY

A compliant material is formed between a base substrate and a support structure prior to performing a controlled spalling process. By positioning the compliant material between the base substrate and the support structure, the localized effects of surface perturbations (particles, wafer artifacts, etc.) on spalling mode fracture can be reduced. The method of the present disclosure thus leads to improved surface quality of the spalled material layer and the remaining base substrate. Moreover, the method of the present disclosure can reduce the density of cleaving artifacts.

In one aspect of the present disclosure, a method for removing a material layer from a base substrate is provided. In one embodiment, the method of the present disclosure includes forming a stressor layer atop a first surface of a base substrate. A second surface of the base substrate, which is opposite the first surface of the base substrate, is then secured to a support structure, wherein a compliant layer is formed interposed between the second surface of the base substrate and the support structure. Next, a material layer of the base substrate is removed by spalling. In accordance with the present disclosure, the material layer that is removed from the base substrate is attached to at least the stressor layer.

In another embodiment of present disclosure, the method includes forming a metal stressor layer atop a first surface of a base substrate. Next, a second surface of the base substrate, which is opposite the first surface of the base substrate, is secured to a support structure, wherein a compliant layer is formed interposed between the second surface of the base substrate and the support structure. A handle substrate is then formed atop the metal stressor layer. Next, a material layer of the base substrate is removed by spalling. In accordance with this embodiment, the material layer is attached to at least the stressor layer, and spalling includes pulling or peeling the handle substrate from atop the metal stressor layer.

DETAILED DESCRIPTION

Figure 1A:
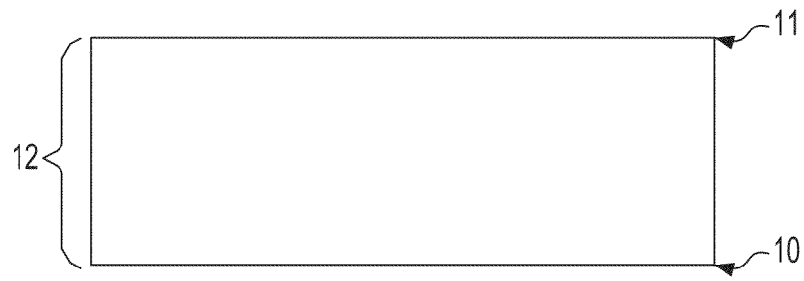
FIG. 1A is a pictorial representation (through a cross sectional view) illustrating a base substrate having an uppermost surface and a bottommost surface that can be employed in one embodiment of the present disclosure.

The present disclosure will now be described in greater detail by referring to the following discussion and drawings that accompany the present application. It is noted that the drawings of the present application are provided for illustrative purposes and, as such, they are not drawn to scale. In the following description, numerous specific details are set forth, such as particular structures, components, materials, dimensions, processing steps and techniques, in order to provide a thorough understanding of the present disclosure. However, it will be appreciated by one of ordinary skill in the art that the present disclosure may be practiced with viable alternative process options without these specific details. In other instances, well-known structures or processing steps have not been described in detail in order to avoid obscuring the various embodiments of the present disclosure.

The application of controlled spalling technology such as disclosed in U.S. Patent Application Publication No. 2010/0311250 A1 to Bedell et al. to very thin substrates (less than 300 μm) renders the fracture depth more susceptible to perturbations due to particles trapped between the rear of the substrate and the surface of the support structure (i.e., vacuum or electrostatic chuck). Without wishing to be bound by any theory, it is believed that the susceptibility noted above is because the depth below the surface at which fracture occurs within the substrate is the location where the shear stress is minimized, and localized stress fields due to localized curvature changes (trapped particles) distort the spatial distribution of the original stress field. As the fracture propagates, the fracture responds to these localized stress perturbations by changing fracture depth to maintain mode II (i.e., shear) stress equal to zero at the crack tip.

For thicker substrates or ingots having a thickness of 300 μm or above, the only non-planar stress perturbations come from inclusions in the stressor layer itself, or within the handle substrate. For a thick substrate being secured to a support structure, the existence of a particle between the thick substrate and the support structure causes a localized curvature change that is both smaller in magnitude and spatially more spread out then if the substrate is very thin.

The present disclosure provides a method to reduce the depth perturbations in controlled spalling technology when thin base substrates (thickness of less than 300 μm) are used. In some embodiments, the base substrate that is subjected to the spalling process of the present disclosure has a thickness from 100 μm up to and including 250 μm. In the present disclosure, the above problem of depth perturbations can be reduced by forming a compliant material interposed between the bottommost surface of the base substrate and a surface of the support structure. The terms "compliant material" or "compliant layer" are used throughout the present disclosure to denote any flexible material that has the ability to deform when a force is applied thereto.

By placing the compliant material interposed between the bottommost surface of the base substrate and a surface of the support structure, the effect of surface perturbations on spalling trajectory can be reduced. This leads to improved surface quality of the spalled material layer and the remaining portion of the base substrate. By "improved surface quality" it is meant that the spalled material layer and the remaining portion of the base substrate after spalling have an overall reduced deviation in spall depth, particularly in the regions near particles trapped between the rear of the substrate and the support structure. In addition, the method of the present disclosure can reduce the density of cleaving artifacts; cleaving artifacts can be defined as any detectable variations in fracture depth that exist on a length scale from a few μms up to a few cms.

Reference is now made to FIGS. 1A, 1B, 2-5, 6A and 6B, which illustrate the basic processing steps of the method of the present disclosure for reducing the depth perturbations in a thin base substrate during controlled spalling.

Referring first to FIG. 1A, there is shown a base substrate 12 having an uppermost surface 11 and a bottommost surface 10 that can be employed in one embodiment of the present disclosure. As shown, the uppermost surface 11 (which may also be referred to as a first surface) of base substrate 12 is opposite the bottommost surface 10 (which may also be referred herein as a second surface) of base substrate 12.

The base substrate 12 that can be employed in the present disclosure may comprise a semiconductor material, a glass, a ceramic, or any another material whose fracture toughness is less than that of the stressor layer to be subsequently formed. Fracture toughness is a property which describes the ability of a material containing a crack to resist fracture. Fracture toughness is denoted $K_{Ic}$. The subscript Ic denotes mode I crack opening under a normal tensile stress perpendicular to the crack, and c signifies that it is a critical value. Mode I fracture toughness is typically the most important value because spalling mode fracture usually occurs at a location in the substrate where mode II stress (shearing) is zero. Fracture toughness is a quantitative way of expressing a material's resistance to brittle fracture when a crack is present.

When the base substrate 12 comprises a semiconductor material, the semiconductor material may include, but is not limited to, Si, Ge, SiGe, SiGeC, SiC, Ge alloys, GaSb, GaP, GaN, GaAs, InAs, InP, AN and all other III-V or II-VI compound semiconductors. In some embodiments, the base substrate 12 is a bulk semiconductor material. In other embodiments, the base substrate 12 may comprise a layered semiconductor material such as, for example, a semiconductor-on-insulator or a semiconductor on a polymeric substrate. Illustrated examples of semiconductor-on-insulator substrates that can be employed as base substrate 12 include silicon-on-insulators and silicon-germanium-on-insulators. In some embodiments, base substrate 12 comprises a mutilayered stack of semiconductor materials. An illustrated example of such a base substrate is a multilayered stack of from bottom to top, a layer of germanium, and a layer of gallium arsenide. When the base substrate 12 comprises a semiconductor material, the semiconductor material can be doped, undoped or contain doped regions and undoped regions.

In one embodiment, the semiconductor material that can be employed as the base substrate 12 can be single crystalline (i.e., a material in which the crystal lattice of the entire sample is continuous and unbroken to the edges of the sample, with no grain boundaries). In another embodiment, the semiconductor material that can be employed as the base substrate 12 can be polycrystalline (i.e., a material that is composed of many crystallites of varying size and orientation; the variation in direction can be random (called random texture) or directed, possibly due to growth and processing conditions). In yet another embodiment of the present disclosure, the semiconductor material that can be employed as the base substrate 12 can be amorphous (i.e., a non-crystalline material that lacks the long-range order characteristic of a crystal). Typically, the semiconductor material that can be employed as the base substrate 12 is a single crystalline material.

When the base substrate 12 comprises a glass, the glass can be a $SiO_2$-based glass which may be undoped or doped with an appropriate dopant. Examples of $SiO_2$-based glasses that can be employed as the base substrate 12 include undoped silicate glass, borosilicate glass, phosphosilicate glass, fluorosilicate glass, and borophosphosilicate glass.

When the base substrate 12 comprises a ceramic, the ceramic can be any inorganic, non-metallic solid such as, for example, an oxide including, but not limited to, alumina, beryllia, ceria and zirconia, a non-oxide including, but not limited to, a carbide, a boride, a nitride or a silicide; or composites that include combinations of oxides and non-oxides.

In some embodiments of the present disclosure, one or more devices including, but not limited to, transistors, capacitors, diodes, BiCMOS, resistors, etc. can be processed on and/or within the base substrate 12 utilizing techniques well known to those skilled in the art. An upper region of the base substrate 12 which may include the one or more devices can be removed utilizing the method of the present disclosure. The upper region of the base substrate 12 may also include one or more III-V compound semiconductor layers which can be used as a photovoltaic device.

In some embodiments of the present disclosure, the uppermost surface 11 of the base substrate 12 can be cleaned prior to further processing to remove surface oxides and/or other contaminants therefrom. In one embodiment of the present disclosure, the uppermost surface 11 of the base substrate 12 is cleaned by applying to the uppermost surface 11 of the base substrate 12 a solvent such as, for example, acetone and isopropanol, which is capable of removing contaminates and/or surface oxides from the uppermost surface 11 of the base substrate 12.

In some embodiments of the present disclosure, the uppermost surface 11 of the base substrate 12 can be made hydrophobic by oxide removal prior to use by dipping the uppermost surface 11 of the base substrate 12 into hydrofluoric acid. A hydrophobic, or non-oxide, surface provides improved adhesion between said cleaned surface and certain stressor layers to be deposited.

Figure 1B:
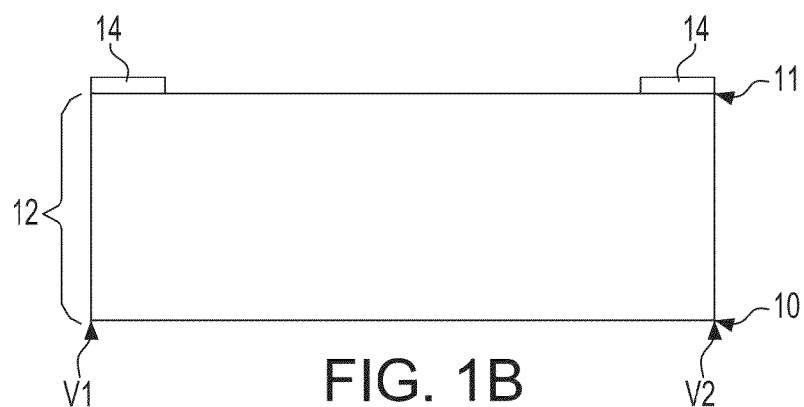
FIG. 1B is a pictorial representation (through a cross sectional view) illustrating a base substrate such as shown in FIG. 1A which also includes an edge exclusion material at the edges of the base substrate in accordance with another embodiment of the present disclosure.

Referring to FIG. 1B, there is illustrated the base substrate 12 after forming an edge exclusion material 14 on the uppermost surface 11 and at the vertical edges V1, V2 of the base substrate 12 which can be employed in another embodiment of the present. As shown, the edge exclusion material 14 has one edge that is vertical coincident with vertical edge V1,V2 of the base substrate 12, while another edge of the edge exclusion material 14 is located inward from edge V1,V2 and on the uppermost surface 11 of the base substrate 12. The term "edge exclusion region" is used throughout the present disclosure to denote an area atop the base substrate 12 in which a subsequently formed stressor layer is either not present or if, present, the stressor layer does not significantly adhere to the uppermost surface 11 of the base substrate 12. The formation of the edge exclusion material 14 minimizes edge-related substrate breakage during spalling.

In one embodiment of the present disclosure, the edge exclusion material 14 can be an adhesion demoter. By "adhesion demoter" it is meant any material that reduces the ability of a subsequently formed optional metal-containing adhesion layer or stressor layer to adhere, i.e., stick, to the uppermost surface 11 of the base substrate 12. The adhesion demoters that can be employed in the present disclosure as the edge exclusion material 14 include, but are not limited to, photoresist materials, polymers, hydrocarbon materials, inks, powders, pastes or non-adherent metals. In one embodiment, the adhesion demoter that can be employed in the present disclosure as the edge exclusion material 14 is an ink.

The photoresist materials that can be employed as the adhesion demoter include any well known positive-tone materials and/or negative-tone materials. The polymers that can be employed as the adhesion demoter include, but are not limited to, natural polymers such as rubbers, shellac, cellulose, synthetic polymers such as nylon, polyethylene and polypropylene, deposited or applied in the form of tape or film. The hydrocarbon materials that can be employed as the adhesion demoter include, but are not limited to, saturated hydrocarbons (i.e., alkanes), unsaturated hydrocarbons (i.e., alkenes or alkynes), cycloalkanes, and aromatic hydrocarbons (i.e., arenes). Inks that can be employed as the adhesion demoter include, but are not limited to, alcohol or water-based inks commonly found in commercial permanent markers or inks used in bubble-jet printing technology. Non-adherent metals that can be employed as the adhesion demoter include, but are not limited to, Au, Ag, solders or low-melting point alloys. Pastes that can be employed as the adhesion demoter include, but are not limited to, metal based pastes, partially-cured epoxies, vacuum grease or similar materials.

The adhesion demoters that can be employed in the present disclosure as the edge exclusion material 14 can be formed onto the uppermost surface 11 of the base substrate 12 near edges V1, V2 utilizing techniques that are well known in the art. For example, the adhesion demoters that can be employed in the present disclosure as the edge exclusion material 14 can be formed by chemical vapor deposition, plasma enhanced chemical vapor deposition, atomic layer deposition, spin-coating, brushing, spray coating, screen-printing, bubble-jet printing, or fabric-tip application. In some embodiments in which inks are employed as the adhesion demoters, the ink can be applied from a pen or marker containing the same. In one embodiment, the edge exclusion material 14 has a width, which is determined from one sidewall edge to another sidewall edge, of from 0.01 mm to 10 mm. In another embodiment, the edge exclusion material 14 has a width of from 0.1 mm to 5 mm. It is observed that the portion of the base substrate 12 that is located directly beneath the edge exclusion material 14 defines an edge exclusion region whose presence minimizes the edge related breakage during a subsequent spalling process.

Figure 2:
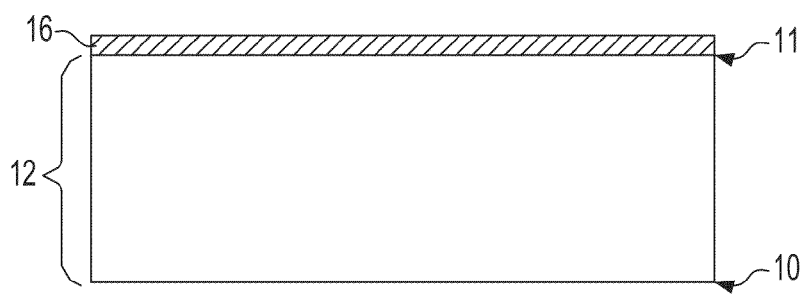
FIG. 2 is a pictorial representation (through a cross sectional view) illustrating the base structure of FIG. 1A after forming a metal-containing adhesion layer on the uppermost surface of the base substrate in accordance with an embodiment of the present disclosure.

Referring now to FIG. 2, there is illustrated the base substrate 12 of FIG. 1A after forming an optional metal-containing adhesion layer 16 on uppermost surface 11 of base substrate 12. Although the present disclosure is now described and illustrated utilizing the structure shown in FIG. 1A, the same processing steps as shown in FIGS. 3-6A can be performing using the structure shown in FIG. 1B with similar results.

The optional metal-containing adhesion layer 16 is employed in embodiments in which the stressor layer to be subsequently formed has poor adhesion to uppermost surface 11 of base substrate 12. Typically, the metal-containing adhesion layer 16 is employed when a stressor layer comprised of a metal is employed. In some embodiments, an optional plating seed layer (not shown) can be formed directly atop the uppermost surface 11 of the base substrate 12. The optional plating seed layer can be used together with the metal-containing adhesion layer 16 or in lieu thereof.

The optional metal-containing adhesion layer 16 employed in the present disclosure includes any metal adhesion material such as, but not limited to, Ti/W, Ti, Cr, Ni or any combination thereof. The optional metal-containing adhesion layer 16 may comprise a single layer or it may include a multilayered structure comprising at least two layers of different metal adhesion materials.

When present, the optional metal-containing adhesion layer 16 can be formed at a temperature from 15° C. to 40° C., i.e., 288K to 313K, or above. In one embodiment, the optional metal-containing adhesion layer 16 can be formed at a temperature which is from 20° C. (293K) to 180° C. (353K). In another embodiment, the optional metal-containing adhesion layer 16 can be formed at a temperature which is from 20° C. (293K) to 60° C. (333K).

The metal-containing adhesion layer 16, which may be optionally employed, can be formed utilizing deposition techniques that are well known to those skilled in the art. For example, the optional metal-containing adhesion layer 16 can be formed by sputtering, chemical vapor deposition, plasma enhanced chemical vapor deposition, chemical solution deposition, physical vapor deposition, and plating. When sputter deposition is employed, the sputter deposition process may further include an in-situ sputter clean process before the deposition.

When employed, the optional metal-containing adhesion layer 16 typically has a thickness from 5 nm to 300 nm, with a thickness from 100 nm to 150 nm being more typical. Other thicknesses for the optional metal-containing adhesion layer 16 that are below and/or above the aforementioned thickness ranges can also be employed in the present disclosure.

The optional plating seed layer (not shown) is typically employed in embodiments in which the stressor layer to be subsequently formed is a metal and plating is used to form the metal-containing stressor layer. The optional plating seed layer is employed to selectively promote subsequent plating of a pre-selected metal-containing stressor layer. The optional plating seed layer may comprise, for example, a single layer of Ni or a layered structure of two or more metals such as Al(bottom)/Ti/Ni(top). The thickness of the optional plating seed layer may vary depending on the material or materials of the optional plating seed layer as well as the technique used in forming the same. Typically, the optional plating seed layer has a thickness from 2 nm to 500 nm. The optional plating seed layer can be formed by a conventional deposition process including, for example, chemical vapor deposition (CVD), plasma-enhanced chemical vapor deposition (PECVD), atomic layer deposition (ALD), and physical vapor deposition (PVD) techniques that may include evaporation and/or sputtering.

In accordance with the present disclosure, the optional metal-containing adhesion layer 16 and/or the optional plating seed layer is (are) formed at a temperature which does not effectuate spontaneous spalling to occur within the base substrate 12.

Figure 3:
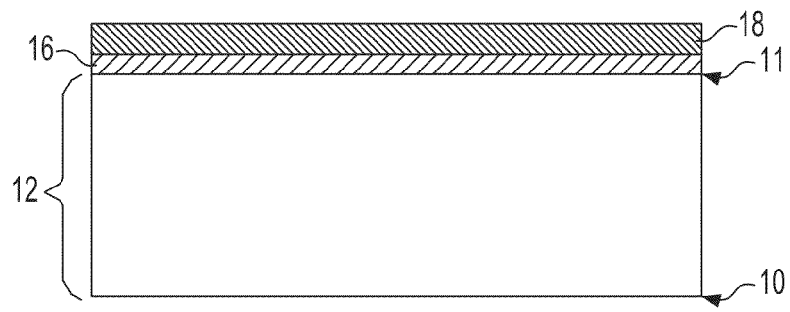
FIG. 3 is a pictorial representation (through a cross sectional view) illustrating the structure of FIG. 2 after forming a stressor layer on a surface of the metal-containing adhesion layer in accordance with an embodiment of the present disclosure.

Referring now to FIG. 3, there is illustrated the structure of FIG. 2 after forming a stressor layer 18 on an uppermost surface of the optional metal-containing adhesion layer 16. In some embodiments in which the optional metal-containing adhesion layer 16 is not present, the stressor layer 18 can be formed directly on the uppermost surface 11 of base substrate 12; this particular embodiment is not shown in the drawings, but can readily be deduced from the drawings illustrated in the present application. In other embodiments in which an optional plating seed layer is employed, the stressor layer 18 can be formed directly on the uppermost surface of the optional plating seed layer; this particular embodiment is also not shown in the drawings, but can readily be deduced from the drawings illustrated in the present application.

The stressor layer 18 that can be employed in the present disclosure includes any material that is under tensile stress on base substrate 12 after deposition. The stressor layer 18 can also be referred to a stress inducing layer. In accordance with the present disclosure, the stressor layer 18 has a critical thickness and a stress value that cause spalling mode fracture to occur within the base substrate 12. In particular, the stressor layer 18 has a critical thickness in which spalling is initiated below the uppermost surface 11 of base substrate 12 and somewhere within the base substrate 12. By 'critical', it is meant that for a given stressor material and base substrate material combination, a thickness value and a stress value for the stressor layer is chosen that render spalling mode fracture possible (can produce a $K_I$ value greater than the $K_{Ic}$ of the substrate). The stress value can be adjusted by tuning the deposition conditions of the stressor layer 18. For example, in the case of sputter deposition of stressor layer 18, the gas pressure can be used to tune the stress value as described in Thorton and Hoffman, *J. Vac. Sci. Technol.*, 14 (1977) p. 164.

The thickness of the stressor layer 18 is chosen to provide the desired fracture depth somewhere within the base substrate 12. For example, if the stressor layer 18 is chosen to be Ni, then fracture will occur at a depth below the stressor layer 18 roughly 2 to 3 times the Ni thickness. The stress value for the stressor layer 18 is then chosen to satisfy the critical condition for spalling mode fracture. This can be estimated by inverting the empirical equation given by $t^*[(2.5\times10^6)(K_{IC}^{3/2})]/\sigma^2$, where $t^*$ is the critical stressor layer thickness (in microns), $K_{IC}$ is the fracture toughness (in units of $MPa \cdot m^{1/2}$) of the base substrate 12 and $\sigma$ is the stress value of the stressor layer (in MPa or megapascals). The above expression is a guide, in practice, spalling can occur at stress or thickness values up to 20% less than that predicted by the above expression.

Illustrative examples of such materials that are under tensile stress when applied atop the base substrate 12 and thus can be employed as the stressor layer 18 include, but are not limited to, a metal, a polymer, such as a spall inducing tape layer, or any combination thereof. The stressor layer 18 may comprise a single stressor layer, or a multilayered stressor structure including at least two layers of different stressor material can be employed.

In one embodiment, the stressor layer 18 is a metal, and the metal is formed on an uppermost surface of the optional metal-containing adhesion layer 16. In another embodiment, the stressor layer 18 is a spall inducing tape, and the spall inducing tape is applied directly to the uppermost surface 11 of the base substrate 12. In another embodiment, for example, the stressor layer 18 may comprise a two-part stressor layer including a lower part and an upper part. The upper part of the two-part stressor layer can be comprised of a spall inducing tape layer.

When a metal is employed as the stressor layer 18, the metal can include, for example, Ni, Cr, Fe, Mo, Ti or W. Alloys of these metals can also be employed. In one embodiment, the stressor layer 18 includes at least one layer consisting of Ni.

When a polymer is employed as the stressor layer 18, the polymer is a large macromolecule composed of repeating structural units. These subunits are typically connected by covalent chemical bonds. Illustrative examples of polymers that can be employed as the stressor layer 18 include, but are not limited to, polyimides polyesters, polyolefins, polyacrylates, polyurethane, polyvinyl acetate, and polyvinyl chloride.

When a spall inducing non-metallic layer (i.e. polymeric materials such as a tape) is employed as the stressor layer 18, the spall inducing layer includes any pressure sensitive tape that is flexible, soft, and stress free at a first temperature used to form the tape, yet strong, ductile and tensile at a second temperature used during removal, i.e., spalling of an upper portion of the base substrate 12. By "pressure sensitive tape," it is meant an adhesive tape that will stick with application of pressure, without the need for solvent, heat, or water for activation. Tensile stress in the tape at the second temperature is primarily due to thermal expansion mismatch between the base substrate 12 (with a lower thermal coefficient of expansion) and the tape (with a higher thermal expansion coefficient).

Typically, the pressure sensitive tape that is employed in the present disclosure as stressor layer 18 includes at least an adhesive layer and a base layer. Materials for the adhesive layer and the base layer of the pressure sensitive tape include polymeric materials such as, for example, acrylics, polyesters, olefins, and vinyls, with or without suitable plasticizers. Plasticizers are additives that can increase the plasticity of the polymeric material to which they are added.

In one embodiment, the stressor layer 18 employed in the present disclosure is formed at room temperature (15° C.-40° C., i.e., 288K-313K). In another embodiment, when a tape layer is employed, the tape layer can be formed at a temperature from 15° C. (288K) to 60° C. (333K).

When the stressor layer 16 is a metal or polymer, the stressor layer 18 can be formed utilizing deposition techniques that are well known to those skilled in the art including, for example, dip coating, spin-coating, brush coating, sputtering, chemical vapor deposition, plasma enhanced chemical vapor deposition, chemical solution deposition, physical vapor deposition, and plating.

When the stressor layer 18 is a spall inducing tape layer, the tape layer can be applied by hand or by mechanical means to the structure. The spall inducing tape can be formed utilizing techniques well known in the art or they can be commercially purchased from any well known adhesive tape manufacturer. Some examples of spall inducing tapes that can be used in the present disclosure as stressor layer 18 include, for example, Nitto Denko 3193MS thermal release tape, Kapton KPT-1, and Diversified Biotech's CLEAR-170 (acrylic adhesive, vinyl base).

In one embodiment, a two-part stressor layer can be formed on the uppermost surface 11 of base substrate 12, wherein a lower part of the two-part stressor layer is formed at a first temperature which is at room temperature or slight above (e.g., from 15° C. (288K) to 60° C. (333K)), wherein an upper part of the two-part stressor layer comprises a spall inducing tape layer at an auxiliary temperature which is at room temperature.

If the stressor layer 18 is of a metallic nature, it typically has a thickness of from 3 μm to 50 μm, with a thickness of from 4 μm to 7 μm being more typical. Other thicknesses for the stressor layer 18 that are below and/or above the aforementioned thickness ranges can also be employed in the present disclosure.

If the stressor layer 18 is of a polymeric nature, it typically has a thickness of from 10 μm to 200 μm, with a thickness of from 50 μm to 100 μm being more typical. Other thicknesses for the stressor layer 18 that are below and/or above the aforementioned thickness ranges can also be employed in the present disclosure.

Figure 4:
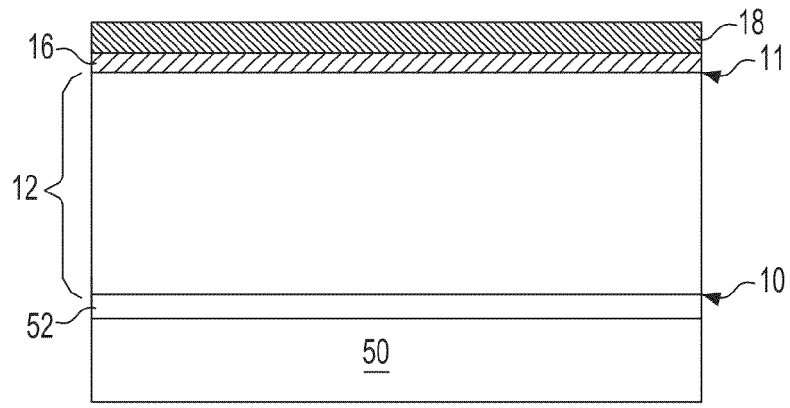
FIG. 4 is a pictorial representation (through a cross sectional view) illustrating the structure of FIG. 3 after securing the bottommost surface of the base substrate to a support structure with a complaint layer interposed between the bottommost surface of the base substrate and the support structure.

Referring now to FIG. 4, there is illustrated the structure of FIG. 3 after securing the bottommost surface 10 of base substrate 12 to a support structure 50 with a complaint layer 52 interposed between the bottommost surface 10 of base substrate 12 and the support structure 50.

The support structure 50 is employed in the present disclosure to hold (i.e., secure) the base substrate 12 during a subsequent controlled spalling process. The support structure 50 that can employed in the present disclosure typically includes a rigid (i.e., non-flexible) surface which includes means for holding the base substrate. Examples of support structures that can be employed in the present disclosure include, for example, a vacuum chuck, an electrostatic chuck, adhesives or edge clamps. The support structure 50, particularly the upper surface thereof, can be composed of any metal including, for example, aluminum. In some embodiments, the support structure 50, particularly the upper surface thereof, can be composed of stainless steel.

The compliant layer 52 that is employed in the present disclosure is an elastic material having a Young's modulus that is less than that of the support structure 50. Young's modulus, also known as the tensile modulus or elastic modulus, is a measure of the stiffness of an elastic material. Young's modulus is defined as the ratio of the uniaxial stress over the uniaxial stain in the range of stress in which Hooke's law applies. In one embodiment, the compliant layer 52 that is employed in the present disclosure has a Young's modulus from 50 kPa to 5 GPa. In another embodiment, the compliant layer 52 that is employed in the present disclosure has a Young's modulus from 100 kPa to 500 MPa. When the compliant layer 52 is deformed due to an external force, it experiences internal forces that oppose the deformation and restore it to its original state if the external force is no longer applied.

As stated above, the compliant layer 52 that is formed interposed between the support structure 50 and the bottommost surface 10 of base substrate 12 comprises a deformable material. In one embodiment of the present disclosure, the complaint layer 52 is comprised of an elastomer. An elastomer is a polymer with viscoelasticity, generally having low Young's modulus and high yield strain compared with other materials. Each of the monomers which link to form the polymer is typically made of carbon, hydrogen, oxygen and/or silicon. Elastomers are amorphous polymers existing above their glass transition temperature, so that considerable segmental motion is possible. Examples of elastomers that can be employed in the present disclosure as the compliant layer 52 include, but are not limited to, natural or synthetic rubbers, silicones, polyolefins, polyvinyl acetate, polymethyl acrylate, viscoelastic gels or foams.

In some embodiments of the present disclosure, the compliant layer 52 can be a tape such as those described above for use as the stressor layer.

In other embodiments of the present disclosure, the compliant layer 52 may contain a plurality of pores or arrays of small holes when support structure 50 includes a vacuum chuck. The role of the pores is to permit transfer of vacuum to the bottommost surface 10 of the base substrate 12.

The compliant layer 52 can be formed interposed between the support structure 50 and the bottommost surface 10 of base substrate 12 by hand or by mechanical means. In some embodiments, the compliant layer 52 can be formed by dip coating, spin-coating, and/or brush coating.

Typically, the complaint layer 52 is formed onto a surface of the support structure 50 and then the layered structure including at least the stressor layer and base substrate is applied to the compliant layer 52. In some embodiments, the compliant layer 52 can be formed on the bottommost surface 10 of the base substrate 12 prior to forming the same on the surface of the support structure.

In one embodiment of the present disclosure, the compliant layer 52 has a thickness from 10 μm to 5 mm. In another embodiment of the present disclosure, the compliant layer 52 has a thickness from 25 μm to 500 μm. Other thicknesses that are greater than or lesser than the aforementioned ranges can also be used as the compliant layer 52.

In some embodiments of the present disclosure, the compliant layer 52 may comprise multiple layers of elastomer materials.

Figure 5:
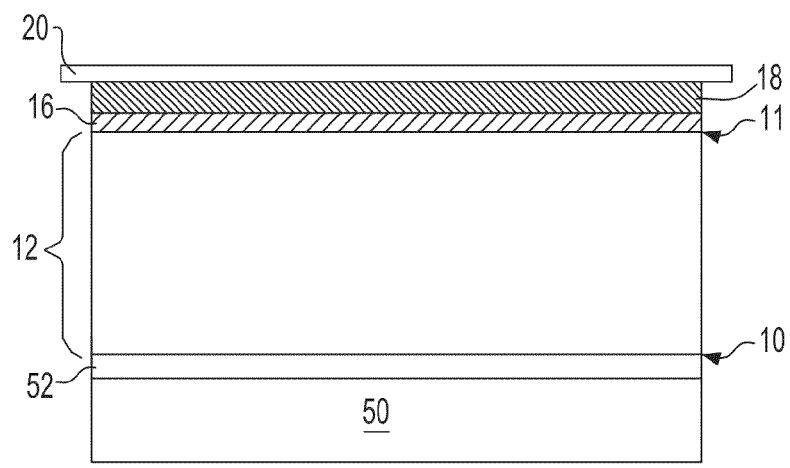
FIG. 5 is a pictorial representation (through a cross sectional view) illustrating the structure of FIG. 4 after forming a handle substrate on a surface of the stressor layer in accordance with an embodiment of the present disclosure.

Referring to FIG. 5, there is illustrated the structure of FIG. 4 after forming an optional handle substrate 20 atop the stressor layer 18. The optional handle substrate 20 employed in the present disclosure comprises any flexible material which has a minimum radius of curvature of less than 30 cm. Illustrative examples of flexible materials that can be employed as the optional handle substrate 20 include a metal foil or a polyimide foil. In some embodiments, a tape, as described above, can be used as the handle substrate 20.

The optional handle substrate 20 can be used to provide better fracture control and more versatility in handling the spalled portion of the base substrate 12. Moreover, the optional handle substrate 20 can be used to guide the crack propagation during the spalling process of the present disclosure. The optional handle substrate 20 of the present disclosure is typically, but not necessarily, formed at a first temperature which is at room temperature (15° C. (288K)-40° C. (313K)).

The optional handle substrate 20 can be formed utilizing deposition techniques that are well known to those skilled in the art including, for example, mechanical pressure, dip coating, spin-coating, brush coating, sputtering, chemical vapor deposition, plasma enhanced chemical vapor deposition, chemical solution deposition, physical vapor deposition, and plating.

The optional handle substrate 20 typical has a thickness of from 5 µm to 500 µm, with a thickness of from 10 µm to 150 µm being more typical. Other thicknesses for the optional handle substrate 20 that are below and/or above the aforementioned thickness ranges can also be employed in the present disclosure.

Figure 6A:
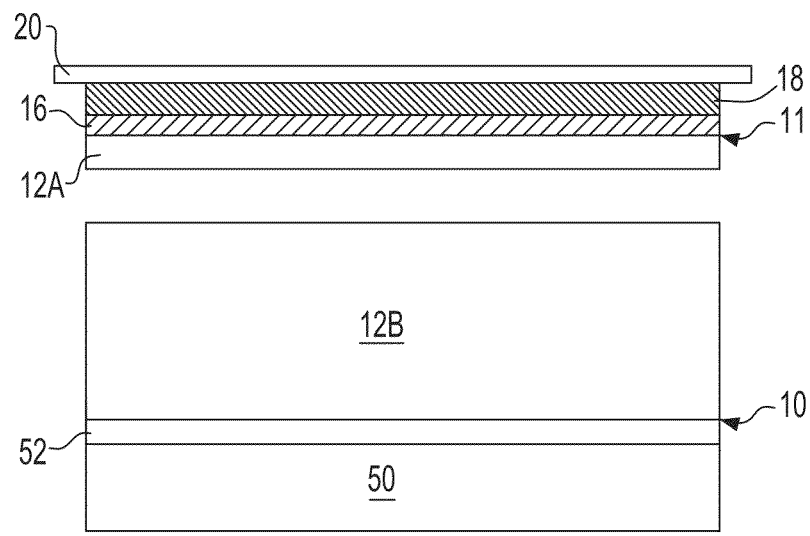
FIG. 6A is a pictorial representation (through a cross sectional view) illustrating the structure of FIG. 5 after performing a spalling process in accordance with an embodiment of the present disclosure.
Figure 6B:
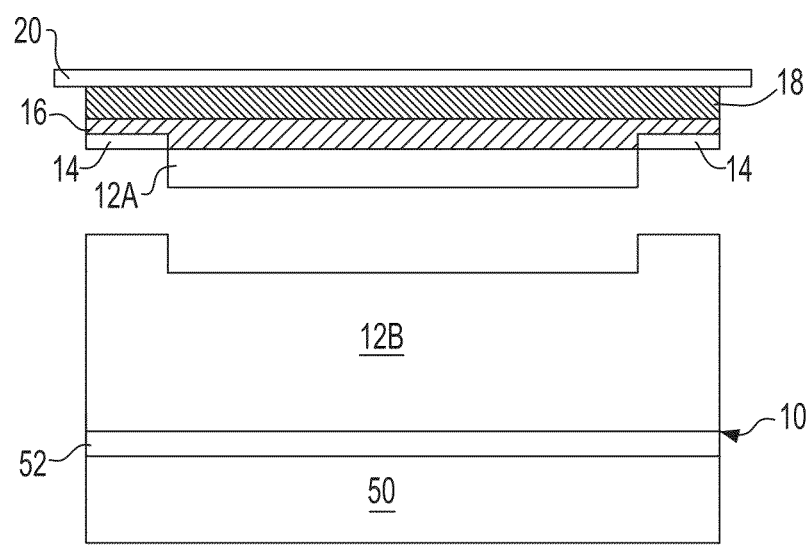
FIG. 6B is a pictorial representation (through a cross sectional view) illustrating another structure that is formed after performing a spalling process in accordance with an embodiment of the present disclosure in which the structure shown in FIG. 1B is employed.

Referring to FIG. 6A, there is illustrated the structure of FIG. 5 after removing an upper portion 12A of the base substrate 12 by spalling. In one embodiment of the present disclosure, the spalling process includes pulling or peeling the handle substrate 20 to remove a spalled structure that includes at least the stressor layer 18 and an upper portion of the base substrate 12. The upper portion of the base substrate that is removed by spalling from the original base substrate 12 may be referred herein as a spalled material layer 12A. The remaining portion of the original base substrate 12 may be referred to herein as remaining base substrate 12B.

The spalling process includes crack formation and propagation within the base substrate 12. The spalling process is initiated at substantially room temperature (i.e., 15° C. to 40° C.). In other embodiments, spalling can be performed at a temperature from 100° C. and below. In some embodiments of the present disclosure, spalling can be initiated by lowering the temperature at a fixed continuous rate. By "fixed continuous rate" it is mean, for example, 20° C. per second utilizing an electronically controlled cooling table or chamber. This method of cooling allows one to reach a pre-specified temperature at which user-defined spalling initiation can induce a pre-determined spalling depth that may be different than that dictated by mere structural parameters (i.e., stressor layer stress and thickness, and fracture toughness of substrate).

After spalling, the optional handle substrate 20, stressor layer 18, and, if present the optional plating seed layer and the optional metal-containing adhesion layer 16 can be removed from the spalled material layer 12A. The optional handle substrate 20, the stressor layer 18, the optional plating seed layer and the optional metal-containing adhesion layer portion 16 can be removed from the spalled material layer 12A that was removed from base substrate 12 utilizing conventional techniques well known to those skilled in the art. For example, and in one embodiment, aqua regia (HNO$_3$/HCl) can be used for removing the optional handle substrate 20, the stressor layer 18, the optional plating seed layer, and the optional metal-containing adhesion layer 16. In another example, UV or heat treatment is used to remove the optional handle substrate 20 followed by a chemical etch to remove the stressor layer 18, followed by a different chemical etch to remove the optional plating seed layer, and optional metal-containing adhesion layer 16.

With respect to the remaining base substrate 12B, the remaining base substrate 12B can be released from the support structure 50 and then the compliant layer 52 can be removed from the remaining base structure 12 by releasing vacuum in the case of a vacuum chuck, or de-energizing electrical power in the case of an electrostatic chuck.

The thickness of the spalled material layer 12A that is removed from the base substrate 12 varies depending on the material of the stressor layer 18 and the material of the base substrate 12 itself. In one embodiment, the spalled material layer 12A that is removed from the base substrate 12 has a thickness of less than 100 microns. In another embodiment, the spalled material layer 12A that is removed from the base substrate 12 has a thickness of less than 50 microns.

In some embodiments in which an edge exclusion material is present at the edges of the base substrate, the spalled structure will also include edge exclusion material located atop and adjacent to the spalled material layer 12A of base substrate 12. Such a structure is shown, for example, in FIG. 6B. In this embodiment, a portion of the base substrate 12 that is located beneath the stressor layer and which is not covered with edge exclusion material will be removed. In some embodiments, an organic solvent such as acetone can be to remove the edge exclusion material 14 from the spalled structure.

The present disclosure can be used in fabricating various types of thin-film devices including, but not limited to, semiconductor devices, photovoltaic devices, and electronic and optoelectronic devices that are flexible.

Figure 7A:
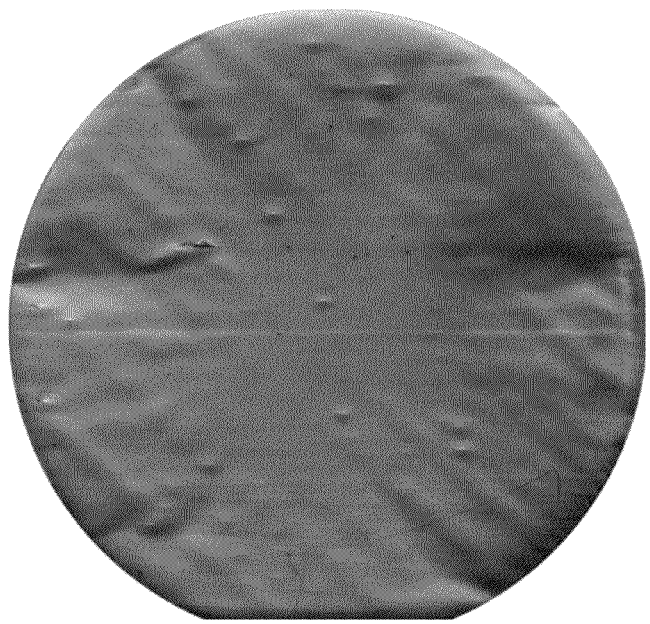
FIG. 7A is an image of a 17 μm thick GaAs/Ge layer spalled from a 4 inch Ge wafer (175 μm) using a prior art spalling process in which no compliant layer is formed between the bottommost surface of the Ge wafer and a surface of a vacuum chuck.
Figure 7B:
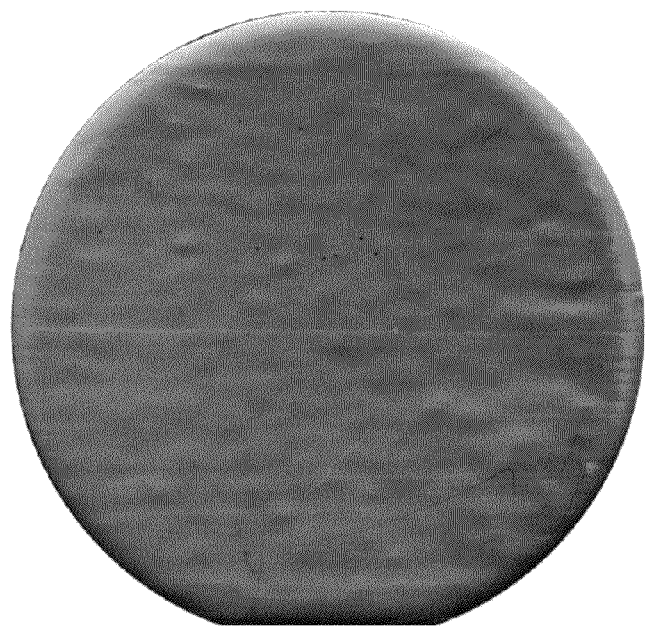
FIG. 7B is an image of a 17 μm thick GaAs/Ge layer spalled from a 4 inch Ge wafer (175 μm) using the spalling process in which a compliant layer was formed between the bottommost surface of the Ge wafer and a surface of a vacuum chuck.

Reference is now made to FIG. 7A which is an image of a 17 µm thick GaAs/Ge layer spalled from a 4 inch Ge wafer (175 µm) using a prior art spalling process in which no compliant layer is formed between the bottommost surface of the Ge wafer and a surface of a vacuum chuck, and FIG. 7B which is an image of a 17 µm thick GaAs/Ge layer spalled from a 4 inch Ge wafer (175 µm) using the spalling process in which a compliant layer was formed between the bottommost surface of the Ge wafer and a surface of a vacuum chuck. In the example shown in FIG. 7B, the compliant layer was a tape comprising a 50 µm Kapton surface layer and a 100 µm thick layer of silicone-based adhesive material. Spalling in each instance was performed at nominal room temperature (15° C. to 40° C.) using a Ni stressor layer and a Kapton tape handle layer. As can be seen in FIG. 7B there is a reduction in surface artifacts in the sample in which the compliant layer was used as compared to the sample as shown in FIG. 7A in which no compliant layer was used.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed as new is:

1. A method for removing a material layer from a base substrate, said method comprising:
    forming a plating seed layer on a surface of a metal-containing adhesion layer, said metal-containing adhesion layer is located atop a first surface of a base substrate;
    forming a stressor layer atop an exposed surface of the plating seed layer;

depositing a compliant layer directly on a second surface of the base substrate that is opposite to said first surface prior to contacting with an underlying support structure;

securing the base substrate to said support structure, wherein said compliant layer is interposed between the second surface of the base substrate and the support structure; and removing a material layer of said base substrate by spalling, wherein said material layer is attached to at least said stressor layer.

2. The method of claim 1, further comprising forming an edge exclusion material on the first surface of the base substrate and at each vertical edge of the base substrate prior to forming the stressor layer.

3. The method of claim 2, wherein said edge exclusion material comprises a photoresist material, a polymer, a hydrocarbon material, an ink, a metal, or a paste.

4. The method of claim 3, wherein said edge exclusion material comprises said ink, and said ink is selected from alcohol and water-based inks.

5. The method of claim 1, wherein the stressor layer comprises a metal, a polymer, a spalling inducing tape or any combination thereof.

6. The method of claim 1, further comprises forming a handle substrate on an exposed surface of the stressor layer.

7. The method of claim 1, wherein said spalling is performed at room temperature.

8. The method of claim 1, wherein the stressor layer is comprised of Ni.

9. The method of claim 6, wherein said spalling comprises pulling or peeling the handle substrate.

10. The method of claim 1, further comprising removing at least said stressor layer from said material layer.

11. The method of claim 1, wherein said support structure is a vacuum chuck or an electrostatic chuck.

12. The method of claim 1, wherein said compliant layer comprises an elastomer having a Young's modulus less than the Young's modulus of the support structure, wherein said elastomer is selected from natural or synthetic rubbers, silicones, adhesives, viscoelastic gels, polyimides polyesters, polyolefins, polyacrylates, polyurethane, polyvinyl acetate, and polyvinyl chloride.

13. The method of claim 1, wherein said compliant layer comprises a tape.

14. A method for removing a material layer from a base substrate, said method comprising:

forming a plating seed layer on a surface of a metal-containing adhesion layer, said metal-containing adhesion layer is located atop a first surface of a base substrate;

forming a stressor layer atop an exposed surface of the plating seed layer;

depositing a compliant layer directly on a second surface of the base substrate that is opposite to said first surface prior to contacting with an underlying support structure;

securing the base substrate to said support structure, wherein said compliant layer is interposed between the second surface of the base substrate and the support structure;

forming a handle substrate atop said metal stressor layer; and removing a material layer of said base substrate by spalling, wherein said material layer is attached to at least said stressor layer, and wherein said spalling comprises pulling or peeling said handle substrate from atop said metal stressor layer.

15. The method of claim 14, further comprising forming an edge exclusion material on the first surface of the base substrate and at each vertical edge of the base substrate prior to forming the metal stressor layer.

16. The method of claim 15, wherein said edge exclusion material comprises a photoresist material, a polymer, a hydrocarbon material, an ink, a metal, or a paste.

17. The method of claim 16, wherein said edge exclusion material comprises said ink, and said ink is selected from alcohol and water-based inks.

18. The method of claim 14, wherein the metal stressor layer comprises Ni.

19. The method of claim 14, wherein said spalling is performed at room temperature.

20. The method of claim 14, further comprising removing at least said metal stressor layer from said material layer.

21. The method of claim 14, wherein said support structure is a vacuum chuck or an electrostatic chuck.

22. The method of claim 14, wherein said compliant layer comprises an elastomer having a Young's modulus less than the Young's modulus of the support structure.

23. The method of claim 14, wherein said compliant layer comprises a tape.

24. A method for removing a material layer from a base substrate, said method comprising:

forming a plating seed layer on a surface of a metal-containing adhesion layer, said metal-containing adhesion layer is located atop a first surface of a base substrate;

forming a stressor layer atop an exposed surface of the plating seed layer;

securing a second surface of the base substrate, which is opposite said first surface of the base substrate, to a support structure, wherein a porous compliant layer is formed interposed between the second surface of the base substrate and the support structure, said porous compliant layer comprising an array of openings within a compliant material and having sidewall edges that are vertical coincident to sidewall edges of at least said base substrate; and removing a material layer of said base substrate by spalling, wherein said material layer is attached to at least said stressor layer.

* * * * *